(12) United States Patent
Wang

(10) Patent No.: US 11,430,855 B2
(45) Date of Patent: Aug. 30, 2022

(54) DISPLAY PANEL HAVING LEVEL SIGNAL WIRING PATTERNS

(71) Applicant: BOE TECHNOLOGY GROUP CO., LTD., Beijing (CN)

(72) Inventor: Li Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 44 days.

(21) Appl. No.: 17/003,872

(22) Filed: Aug. 26, 2020

(65) Prior Publication Data

US 2021/0193776 A1 Jun. 24, 2021

(30) Foreign Application Priority Data

Dec. 20, 2019 (CN) .......................... 201911335096.6

(51) Int. Cl.

| H01L 29/08 | (2006.01) |
|---|---|
| H01L 27/32 | (2006.01) |
| H01L 51/56 | (2006.01) |
| H01L 51/52 | (2006.01) |

(52) U.S. Cl.
CPC ...... H01L 27/3276 (2013.01); H01L 51/5206 (2013.01); H01L 51/5221 (2013.01); H01L 51/56 (2013.01); H01L 2227/323 (2013.01)

(58) Field of Classification Search
CPC ............. H01L 27/3276; H01L 51/5206; H01L 51/5221; H01L 51/56; H01L 2227/323
USPC .......................................................... 257/40
See application file for complete search history.

(56) References Cited

U.S. PATENT DOCUMENTS

| 2018/0006098 A1* | 1/2018 | Hong | H01L 27/3279 |
| 2018/0182821 A1* | 6/2018 | Yun | H01L 27/3258 |
| 2020/0119115 A1* | 4/2020 | Moon | G09G 3/3266 |
| 2020/0185489 A1* | 6/2020 | Jo | H01L 27/3248 |

FOREIGN PATENT DOCUMENTS

| CN | 107579076 A | 1/2018 |
| CN | 107611283 A | 1/2018 |
| CN | 109360900 A | 2/2019 |

OTHER PUBLICATIONS

Office Action issued in corresponding Chinese Patent Application No. 201911335096.6, dated Feb. 25, 2022.

* cited by examiner

*Primary Examiner* — Phuc T Dang
(74) *Attorney, Agent, or Firm* — McDermott Will & Emery LLP

(57) ABSTRACT

The present disclosure provides a display panel and a method for manufacturing the display panel. The display panel includes: a base substrate; a conductive layer on the base substrate including a level signal wiring pattern; a cathode layer on a side of the conductive layer away from the base substrate; an anode layer on the side of the conductive layer away from the base substrate and on a side of the cathode layer facing the base substrate; a thin film transistor on a side of the anode layer facing the base substrate and on the side of the conductive layer away from the base substrate, including a source electrode, a drain electrode, an active layer, and a gate electrode, wherein the level signal wiring pattern is electrically connected to the cathode layer.

14 Claims, 9 Drawing Sheets

DISPLAY PANEL HAVING LEVEL SIGNAL WIRING PATTERNS

CROSS-REFERENCE TO RELATED APPLICATION

This application claims the benefit of Chinese Patent Application No. 201911335096.6 filed on Dec. 20, 2019 in the National Intellectual Property Administration of China, the whole disclosure of which is incorporated herein by reference.

TECHNICAL FIELD

The present disclosure relates to the field of display technology, and particularly to a display panel and a method for manufacturing the display panel.

BACKGROUND

Power consumption is one of important evaluation indicators of consumer products. The power consumption of OLED (Organic Light-Emitting Diode) display panels mainly includes power consumption caused by logic operations in integrated circuits and light-emitting power consumption of luminescent materials. The light-emitting power consumption of the luminescent material depends on a voltage difference across the luminescent material and a current flowing through electrodes on both sides of the luminescent material. When the maximum brightness of the OLED display panel is unchanged, the overall current on the display panel is approximately constant. Therefore, the light-emitting power consumption of the luminescent material is mainly determined by the voltage difference between the high-voltage level signal (VDD) and low-voltage level signal (VSS) across the luminescent material. At present, the low-voltage level signal is mainly transmitted through a cathode layer.

SUMMARY

According to an aspect of the present disclosure, a display panel is provided, comprising: a base substrate; a conductive layer on the base substrate, the conductive layer comprising a level signal wiring pattern; a cathode layer on a side of the conductive layer away from the base substrate; an anode layer on the side of the conductive layer away from the base substrate and on a side of the cathode layer facing the base substrate; a thin film transistor on a side of the anode layer facing the base substrate and on the side of the conductive layer away from the base substrate, the thin film transistor comprising a source electrode, a drain electrode, an active layer, and a gate electrode, wherein the level signal wiring pattern is electrically connected to the cathode layer.

According to some exemplary embodiments, the thin film transistor is a P-type thin film transistor.

According to some exemplary embodiments, the conductive layer further comprises a first group of hollow portions, an orthographic projection of the first group of hollow portions on the base substrate covers an orthographic projection of the gate electrode of the P-type thin film transistor on the base substrate.

According to some exemplary embodiments, the conductive layer further comprises a first group of hollow portions, an orthographic projection of the first group of hollow portions on the base substrate covers an orthographic projection of the P-type thin film transistor on the base substrate.

According to some exemplary embodiments, an area of the orthographic projection of the first group of hollow portions on the base substrate is larger than an area of the orthographic projection of the P-type thin film transistor on the base substrate.

According to some exemplary embodiments, the thin film transistor is an N-type thin film transistor.

According to some exemplary embodiments, an orthographic projection of the level signal wiring pattern on the base substrate covers an orthographic projection of the N-type thin film transistor on the base substrate.

According to some exemplary embodiments, the display panel further comprises a signal line on the side of the anode layer facing the base substrate, and on the side of the conductive layer away from the base substrate, the conductive layer further comprises a second group of hollow portions, and an orthographic projection of the second group of hollow portions on the base substrate at least partially overlaps with an orthographic projection of the signal line on the base substrate.

According to some exemplary embodiments, the signal line comprises a data line or a clock signal line.

According to some exemplary embodiments, the conductive layer further comprises a third group of hollow portions, an orthographic projection of the third group of hollow portions on the base substrate neither overlaps with the orthographic projection of the thin film transistor on the base substrate, nor overlaps with the orthographic projection of the signal line on the base substrate.

According to some exemplary embodiments, the level signal wiring pattern is a mesh pattern.

According to some exemplary embodiments, the display panel comprises a display area and a peripheral area, an electrical connection portion is provided in the peripheral area, and the level signal wiring pattern is electrically connected to the cathode layer through the electrical connection portion.

According to some exemplary embodiments, the electrical connection portion comprises: a first electrical connection layer, the first electrical connection layer being made of the same material and arranged in the same layer as the anode layer, the first electrical connection layer being electrically connected with the cathode layer; and a second electrical connection layer, the second electrical connection layer being made of the same material and arranged in the same layer as the source electrode and the drain electrode of the thin film transistor, the second electrical connection layer being electrically connected with the level signal wiring pattern; wherein the first electrical connection layer is electrically connected with the second electrical connection layer.

According to some exemplary embodiments, the display panel further comprises: a luminescent material layer between the anode layer and the cathode layer.

According to some exemplary embodiments, the display panel further comprises: an integrated circuit interface; a first connection bus that electrically connects the level signal wiring pattern to the integrated circuit interface; and a second connection bus that electrically connects the cathode layer to the integrated circuit interface.

According to some exemplary embodiments, the first connection bus is made of the same material and arranged in the same layer as the conductive layer, and the second connection bus is made of the same material and arranged in the same layer as the cathode layer.

According to some exemplary embodiments, an orthographic projection of the level signal wiring pattern on the base substrate at least partially overlaps with an orthographic projection of the cathode layer on the base substrate.

According to another aspect of the present disclosure, there is provided a method for manufacturing a display panel, comprising: providing a base substrate; forming a conductive layer on the base substrate, the conductive layer comprising a level signal wiring pattern; forming a thin film transistor on a side of the conductive layer away from the base substrate; forming an anode layer on a side of the thin film transistor away from the base substrate; and forming a cathode layer on a side of the conductive layer away from the base substrate, wherein the cathode layer is electrically connected to the level signal wiring pattern.

BRIEF DESCRIPTION OF THE DRAWINGS

In order to more clearly explain technical solutions in embodiments of the present disclosure or related technologies, the drawings required in the description of the embodiments will be briefly introduced below. Obviously, the drawings in the following description are only some embodiments of the present disclosure. For those of ordinary skill in the art, without paying any creative labor, other drawings can also be obtained from these drawings.

DETAILED DESCRIPTION OF EMBODIMENTS

To make objectives, technical solutions, and advantages of the embodiments of the present disclosure more clear, the technical solutions in the embodiments of the present disclosure will be described clearly and completely in conjunction with the drawings in the embodiments of the present disclosure. Obviously, the described embodiments are a part, but not all of the embodiments of the present disclosure. Based on the described embodiments of the present disclosure, all other embodiments obtained by a person of ordinary skill in the art without creative labor fall within the protection scope of the present disclosure. It should be noted that throughout the drawings, the same elements are denoted by the same or similar reference signs. In the following description, some specific embodiments are for descriptive purposes only, and should not be construed as limiting the present disclosure, but are merely examples of embodiments of the present disclosure. The conventional structure or configuration will be omitted to avoid confusion to the understanding of the present disclosure. It should be noted that the shapes and sizes of the components in the figures do not reflect the true sizes and proportions, but only illustrate the contents of the embodiments of the present disclosure.

Unless otherwise defined, the technical terms or scientific terms used in the embodiments of the present disclosure should have a common meaning understood by those skilled in the art. The terms "first", "second" and similar words used in the embodiments of the present disclosure do not represent any order, quantity or importance, but are only used to distinguish different components.

In addition, in the description of the embodiments of the present disclosure, the term "electrically connected" may refer to a direct electrical connection between two components, or may refer to an electrical connection between two components via one or more other components.

Herein, the expression "pattern" means one or more solid material parts provided on the base substrate of the display panel, for example, the one or more solid material parts may be formed as a certain pattern, a plurality of solid material parts may extend continuously, or at least some of the solid material parts may be separated, and the specific shape and connection mode of the pattern are not specifically limited herein. As another example, the "pattern" may be a structure including the material formed by performing a patterning process on a material film layer provided on the base substrate.

The transistors used in the embodiments of the present disclosure may all be thin film transistors, field effect transistors, or other devices with the same characteristics. Since the source electrode and drain electrode of the thin film transistor used here are symmetrical, the source electrode and drain electrode may be interchanged.

Figure 1:
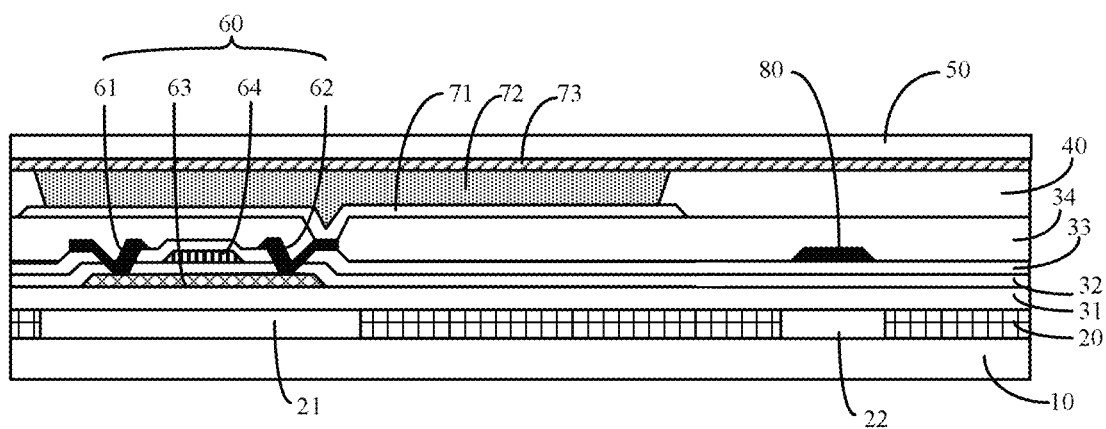
FIG. 1 schematically shows an exemplary film structure diagram of an OLED display panel.

FIG. 1 schematically shows an exemplary partial film structure diagram of an OLED display panel. The display panel 100 includes a base substrate 10, a conductive layer 20 on the base substrate 10, and a cathode layer 73 on a side of the conductive layer 20 away from the base substrate 10. A level signal wiring pattern is located in the conductive layer 20, and an orthographic projection of the level signal wiring pattern on the base substrate 10 at least partially overlaps with an orthographic projection of the cathode layer 73 on the base substrate 10. In some embodiments, the display panel 100 may further include an anode layer 71 and a luminescent material layer 72. The anode layer 71 is located on the side of the conductive layer 20 away from the base substrate 10 and on a side of the cathode layer 73 facing the base substrate 10. The luminescent material layer 72 is located between the anode layer 71 and the cathode layer 73. When a high-voltage level signal and a low-voltage level signal are applied to the anode layer 71 and the cathode layer 73, respectively, the luminescent material layer 72 will emit light under the excitation of the voltage difference between the anode layer 71 and the cathode layer 73. The light-emitting power consumption of the luminescent material layer is largely determined by the voltage difference between the high-voltage level signal and the low-voltage level signal.

In the display panel of the related art, the high-voltage level signal (VDD) is usually only transmitted in the anode layer 71, and the low-voltage level signal (VSS) is usually only transmitted in the cathode layer 73, and the conductive layer 20 is only used to block external light to prevent interference of external light on circuit components. In the embodiment of the present disclosure, a level signal wiring pattern is formed in the conductive layer 20, and the level signal wiring pattern is electrically connected to the cathode layer 73. In this way, low-voltage level signals can be transmitted not only in the cathode layer 73, but also in the conductive layer 20. For the display panel, the low-voltage level signal is usually introduced into the display area from the peripheral area around the display area on the display panel. The level signal wiring pattern 20 may be laid out in a larger area in the display panel, and the low-voltage level signal is transmitted in both the cathode layer 73 and the conductive layer 20 at the same time, thus, on the one hand, a total resistance may be smaller than that when it is only transmitted in the cathode layer 73, so that the voltage drop (caused by the resistance) of the low-voltage level signal during the transmission from the peripheral area to the display area will be reduced, thereby reducing the voltage difference on both sides of the luminescent material layer 72 and reducing power consumption; on the other hand, the current that originally flowed only through the cathode layer 73 is distributed in both the cathode layer 73 and the conductive layer 20, the conductive area increases, and the current distribution and the heat dissipation are more uniform. The electrical connection between the level signal wiring pattern in the conductive layer 20 and the cathode layer 73 will be described hereinafter.

In addition, in the layered structure, the conductive layer 20 is usually provided at a position close to the base substrate 10, for example, directly on the base substrate 10. Therefore, it is possible to form the level signal wiring pattern in the conductive layer 20 to prevent the level signal wiring pattern from interfering other layer structures in the display area and to avoid increasing the complexity of the process. In this case, there is no need to provide a new level signal wiring layer, but only some pattern design is required in the conductive layer 20, which basically has no effect on the flow of the manufacturing process.

In some embodiments, the display panel 100 may further include a thin film transistor (TFT) 60 on a side of the anode layer 71 facing the base substrate 10 and on a side of the conductive layer 20 away from the base substrate 10. As an example, the thin film transistor 60 may include, for example, a source electrode 61, a drain electrode 62, an active layer 63, and a gate electrode 64. In some embodiments, the thin film transistor 60 shown in FIG. 1 may be a P-type thin film transistor. In some embodiments, in order to insulate various conductive film layer structures, some insulating layers may also be provided, for example, a buffer layer 31 may be provided between the conductive layer 20 and the active layer 63, a gate insulating layer 32 may be provided between the active layer 63 and the gate electrode 64, an interlayer dielectric layer 33 may be provided between the gate electrode 64 and a layer where the source electrode 61 and the drain electrode 62 are located, and a planarization layer 34 may be provided between the anode layer 71 and the layer where the source electrode 61 and the drain electrode 62 are located. In some embodiments, a pixel defining layer 40 may also be provided to limit the luminescent material layer 72 in a desired area. In some embodiments, a sealing layer (or encapsulation layer) 50 may also be provided on a side of the cathode layer 73 away from the base substrate 10 to protect the functional film layer structures of the display panel 100.

Figure 2:
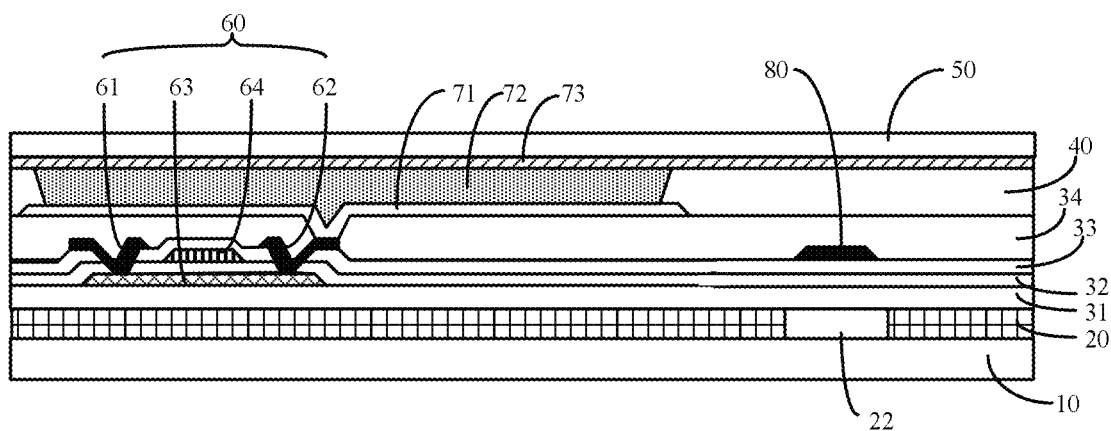
FIG. 2 schematically shows an exemplary film structure diagram of another OLED display panel.

FIG. 2 schematically shows an exemplary partial film structure diagram of another OLED display panel. The thin film transistor 60 may be an N-type thin film transistor, and an orthographic projection of the conductive layer 20 on the base substrate 10 covers an orthographic projection of the N-type thin film transistor on the base substrate 10.

The structural positional relationship among the conductive layer 20, the cathode layer 73, and other functional layers has been described above from the perspective of the exemplary basic structure of the OLED display panel. The embodiments of the present disclosure are not limited to the above examples. Hereinafter, as an example, an arrangement with which the level signal wiring pattern is arranged in the conductive layer 20 will be described.

Figure 3:
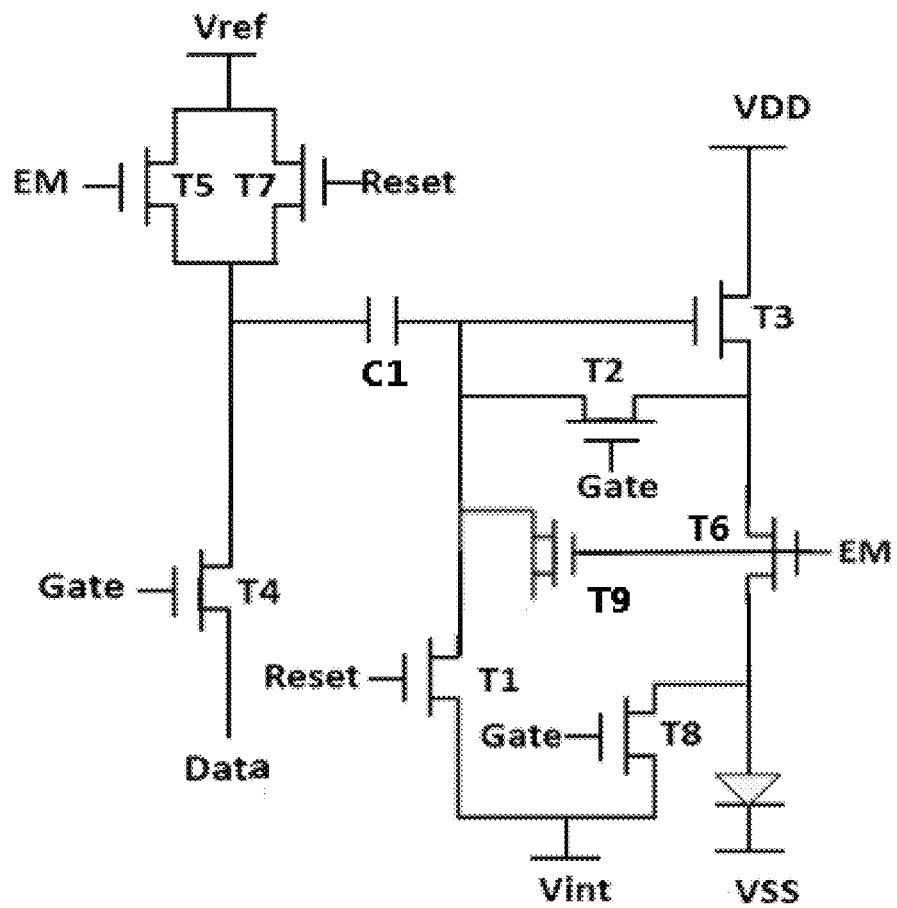
FIG. 3 shows a schematic diagram of an exemplary pixel driving circuit of an OLED display panel.

FIG. 3 shows a schematic diagram of an exemplary pixel driving circuit of the OLED display panel shown in FIG. 1. The pixel driving circuit includes a plurality of elements, such as a first thin film transistor T1, a second thin film transistor T2, a third thin film transistor T3, a fourth thin film transistor T4, a fifth thin film transistor T5, a sixth thin film transistor T6, a seventh thin film transistor T7, an eighth thin film transistor T8, a ninth thin film transistor T9, and a storage capacitor C1. Among them, gate electrodes of the first thin film transistor T1, the second thin film transistor T2, the fourth thin film transistor T4, the fifth thin film transistor T5, the sixth thin film transistor T6, the seventh thin film transistor T7, and the eighth thin film transistor T8 are respectively controlled by EM, Reset, Gate and other specific signals. The third thin film transistor T3 is mainly used to drive the light-emitting element to emit light. The VDD and VSS signals are DC voltage signals, and are used to provide voltages required for driving the light-emitting element to emit light. The data line (Data) is used to input a data signal for controlling the light-emitting element to emit light. Vref and Vint are two voltage signals. Since the above basic driving circuit includes 9 thin film transistors and one storage capacitor, it is called a 9T1C circuit. The circuit is described here only to illustrate that the driving circuit on the display panel may include several thin film transistors, and the conductive layer 20 in the display panel according to some embodiments of the present disclosure may be designed based on this. The detailed working principle of the above circuit is not the content of the present disclosure, so it is omitted here.

Figure 4:
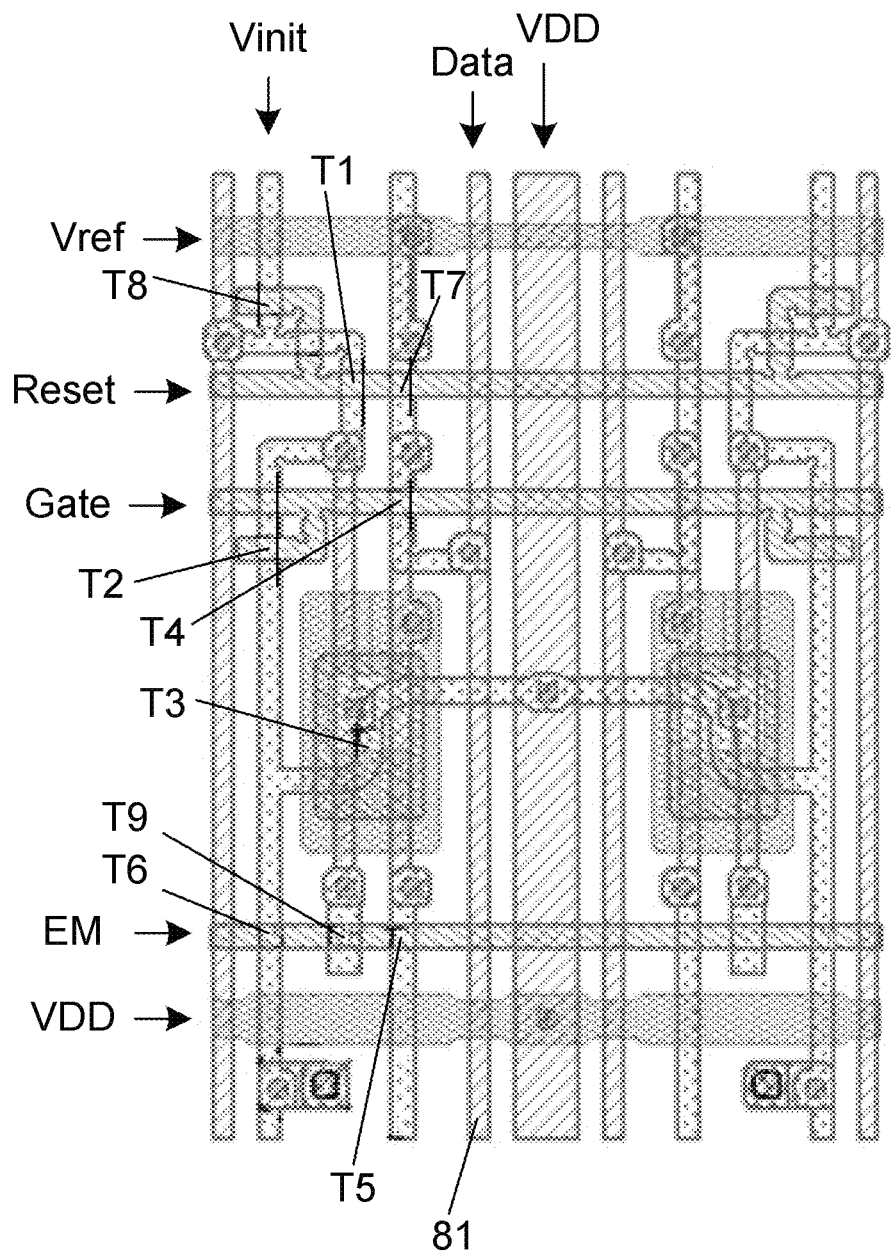
FIG. 4 schematically shows a circuit layout diagram corresponding to the driving circuit of FIG. 3.

FIG. 4 shows an exemplary layout structure diagram of the above circuit implemented in the display panel shown in FIG. 1. It shows a number of transistor structures, such as a first thin film transistor T1, a second thin film transistor T2, a third thin film transistor T3, a fourth thin film transistor T4, a fifth thin film transistor T5, a sixth thin film transistor T6, a seventh thin film transistor T7, an eighth thin film transistor T8, and a ninth thin film transistor T9. In the actual layer structure, as shown in FIG. 1, the gate electrode 64 is on a side of the active layer 63 away from the base substrate 10, and the conductive layer 20 is located on a side of the active layer 63 facing the base substrate 10. In the case of the conductive layer 20 is not energized, the conductive layer 20 will not affect the operation of each thin film transistor, but in the embodiment of the present disclosure, a level signal wiring pattern is formed in the conductive layer 20 and used to transmit the low-voltage level signal (for example, the voltage may be −2 volts to −4 volts). In this way, if the orthographic projection of the conductive layer 20 on the base substrate 10 overlaps with the orthographic projection of a thin film transistor (e.g., the first thin film transistor T1, the second thin film transistor T2, the third thin film transistor T3, the fourth thin film transistor T4, the fifth thin film transistor T5, the sixth thin film transistor T6, the seventh thin film transistor T7, the eighth thin film transistor T8 or the ninth thin film transistor T9) on the base substrate 10, a gate voltage of the thin film transistor may be affected. This is detrimental to the operation of the pixel unit on the display panel and the GOA (gate driver on an array substrate) circuit.

Figure 5:
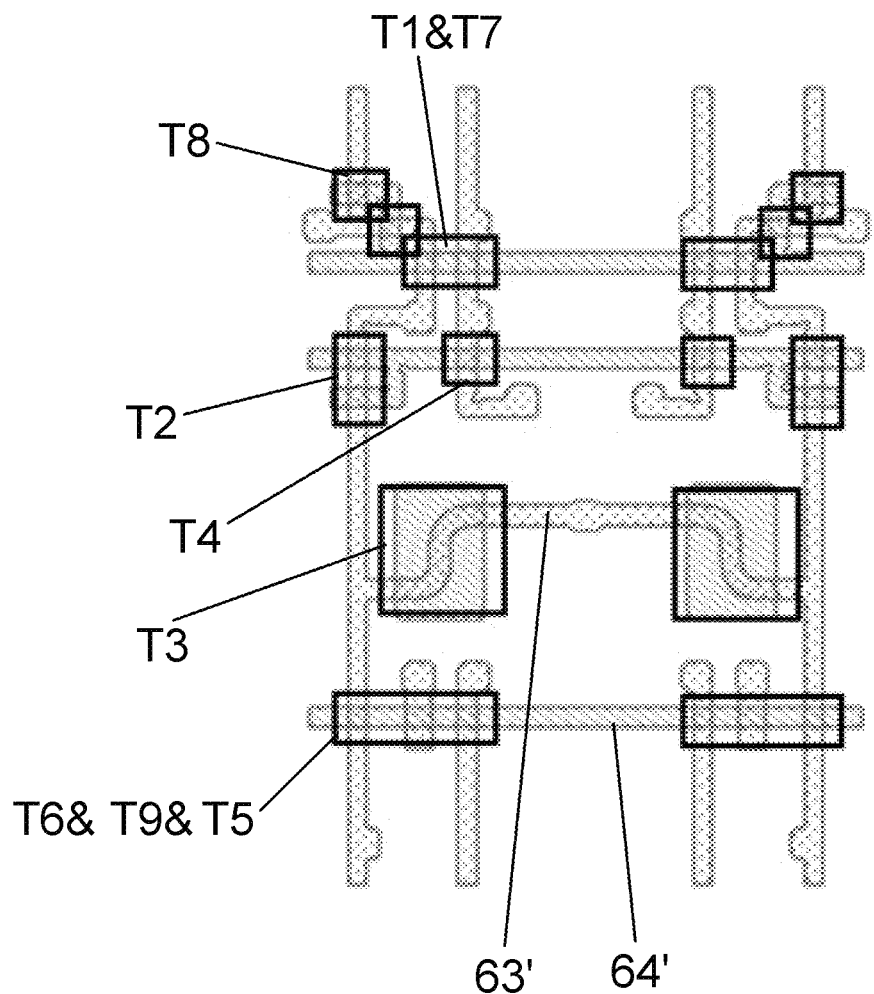
FIG. 5 schematically shows positions of TFTs (thin film transistors) on a display panel according to some embodiments of the present disclosure.
Figure 6:
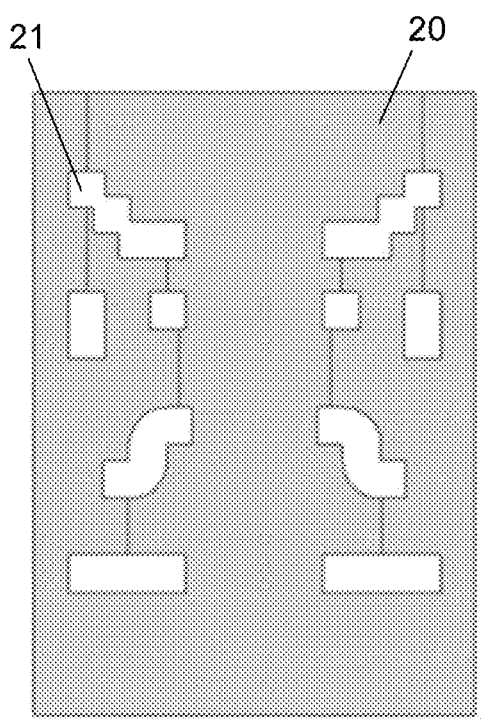
FIG. 6 schematically shows an exemplary conductive layer pattern on a display panel according to some embodiments of the present disclosure.

Therefore, in some embodiments, the conductive layer 20 may be provided with a first group of hollow portions 21. An orthographic projection of the first group of hollow portions 21 on the base substrate 10 covers the orthographic projection of at least one thin film transistor on the base substrate 10. In FIG. 5, the thin film transistors (for example, the first thin film transistor T1, the second thin film transistor T2, the third thin film transistor T3, the fourth thin film transistor T4, the fifth thin film transistor T5, the sixth thin film transistor T6, the seventh thin film transistor T7, the eighth thin film transistor T8 or the ninth thin film transistor T9) on the display panel are marked with multiple boxes. For clarity, only the gate layer 64' and the active layer 63' are shown in FIG. 5. FIG. 6 shows positions of each hollow portion 21 in the first group of hollow portions 21 in the conductive layer 20. In the embodiments of the present disclosure, as described above, the positions of the hollow portions 21 in the conductive layer 20 correspond to positions of the thin film transistors in the display panel. Due to the hollow portion 21, the conductive layer 20 may avoid the positions of the corresponding thin film transistors, which may prevent the level signal wiring pattern in the conductive layer 20 from affecting the thin film transistors corresponding to the hollow portions 21 to a great extent. In some embodiments, the orthographic projection of the hollow portion 21 on the base substrate 10 may completely overlap with the orthographic projection of the corresponding thin film transistor on the base substrate 10. In other embodiments, the orthographic projection of the hollow portion 21 on the base substrate 10 may also cover the orthographic projection of the corresponding thin film transistor on the base substrate 10, and an area of the orthographic projection of the hollow portion 21 on the base substrate 10 may be larger than an area of the orthographic projection of the corresponding thin film transistor on the base substrate 10. The area of the orthographic projection of the hollow portion 21 on the base substrate 10 is larger than the area of the orthographic projection of the corresponding thin film transistor on the base substrate 10, so that it is possible that the hollow portion 21 and the thin film transistor have a certain alignment error when they are aligned in a direction perpendicular to the base substrate 10.

In some embodiments, the orthographic projection of the hollow portion 21 on the base substrate 10 may completely overlap with the orthographic projection of the gate electrode of the corresponding thin film transistor on the base substrate 10. In other embodiments, the orthographic projection of the hollow portion 21 on the base substrate 10 may also cover the orthographic projection of the gate electrode of the corresponding thin film transistor on the base substrate 10, and an area of the orthographic projection of the hollow portion 21 on the base substrate 10 may be larger than an area of the orthographic projection of the gate electrode of the corresponding thin film transistor on the base substrate 10.

Figure 7:
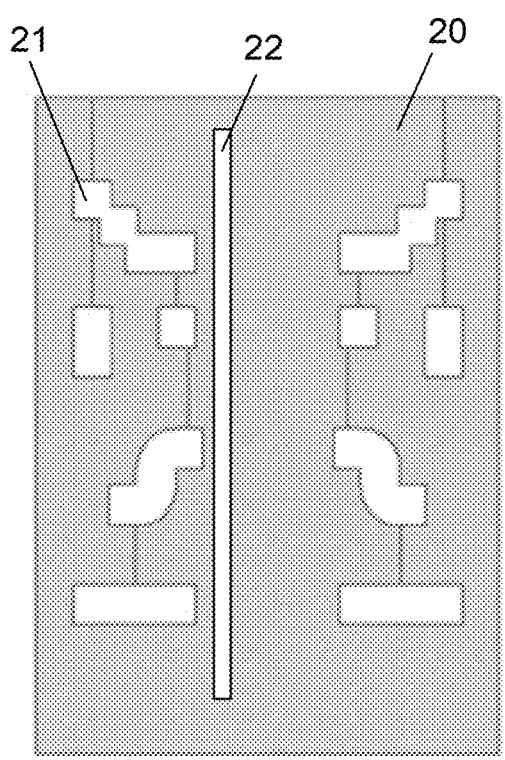
FIG. 7 schematically shows another exemplary conductive layer pattern on a display panel according to some embodiments of the present disclosure.

In addition to the thin film transistors or the gate electrodes of the thin film transistors, the conductive layer 20 may also avoid some signal lines on the display panel. In some embodiments, the display panel may further include a signal line 80 that is located on a side of the anode layer 71 facing the base substrate 10 and on a side of the conductive layer 20 away from the base substrate 10. The conductive layer 20 includes a second group of hollow portions 22. An orthographic projection of the second group of hollow portions 22 on the base substrate 10 at least partially overlaps with an orthographic projection of at least one signal line 80 on the base substrate 10. For example, the signal line 80 may include a data line 81 or a clock signal line. In FIG. 4, a data line 81 is shown. In the example of the conductive layer 20 shown in FIG. 7, a portion corresponding to the data line 81 forms the second group of hollow portion 22. In the pattern design of the conductive layer 20, some wires such as signal lines may be avoided. The signal lines include, for example, data lines or clock signal lines. As a result, a parasitic capacitance between the conductive layer 20 and the signal line may be reduced, and it is beneficial to reduce the load of the signal line. In the embodiments of the present disclosure, the hollow portions in the first group of hollow portions 21 and the second group of hollow portions 22 may have any shape, and the shape is expected to match the structure of the thin film transistors or the signal lines that need to be avoided. It should be noted that the orthographic projection of the second group of hollow portions 22 on the base substrate 10 does not necessarily completely cover the orthographic projection of the signal line 80 on the base substrate 10, and may also partially overlap the orthographic projection of the signal line 80 on the base substrate 10, as long as the parasitic capacitance between the conductive layer 20 and the signal line 80 is reduced.

Figure 8:
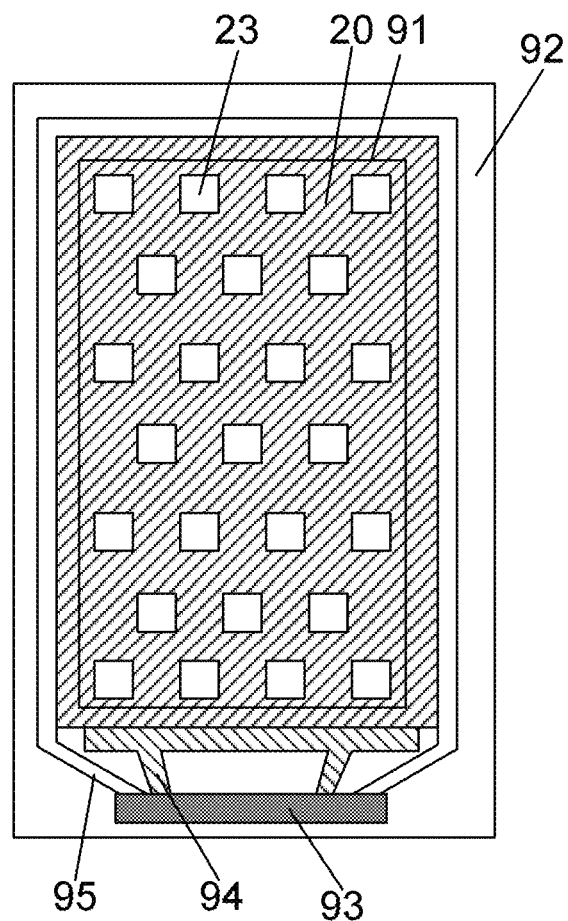
FIG. 8 schematically shows a top view of a display panel according to some embodiments of the present disclosure.

In addition, in some embodiments, the conductive layer 20 in the display panel may be further patterned to reduce the area of the conductive layer 20. For example, the conductive layer 20 may further include a third group of hollow portions 23, and an orthographic projection of the third group of the hollow portions 23 on the base substrate 10 neither overlap with the orthographic projection of the thin film transistor on the base substrate 10, nor overlap with the orthographic projection of the signal line 80 on the base substrate 10. In some embodiments, the level signal wiring pattern in the conductive layer 20 may be a mesh pattern, as shown in FIG. 8. This mesh pattern is advantageous for the subsequent chemical vapor deposition (CVD) process, because if the conductive layer 20 forms a full-surface metal layer, it may interfere with the electromagnetic field of the CVD equipment.

Optionally, referring to FIG. 2, if the thin film transistor is the N-type transistor, the conductive layer 20 is not hollow at the positions corresponding to the transistors. In such as case, the orthographic projection of the level signal wiring pattern in the conductive layer 20 on the base substrate covers the orthographic projection of the N-type transistor on the base substrate. In this way, the low-voltage level signal (for example, the voltage may be between −2 volts to −4 volts) is applied to the level signal wiring pattern in the conductive layer 20, so that it is beneficial for the N-type transistor.

FIG. 8 shows a top view of a display panel according to an embodiment of the present disclosure. As can be seen from FIG. 8, the display panel includes a display area 91 and a peripheral area 92. An integrated circuit interface 93 is provided on one side (lower side in the figure) of the peripheral area 92. In the embodiment of the present disclosure, the low-voltage level signal is simultaneously transmitted through the level signal wiring pattern in the conductive layer 20 and the cathode layer 73. A first connection bus 94 and a second connection bus 95 may be provided in the peripheral area 92 of the display panel. The first connection bus 94 is used to electrically connect the level signal wiring pattern in the conductive layer 20 to the integrated circuit interface 93, and the second connection bus 95 is used to electrically connect the cathode layer 73 to the integrated circuit interface 93. The second connection bus 95 may also be electrically connected to the cathode layer 73 through wires on other sides (upper side, left side, and right side in the figure) of the peripheral area 92. In some embodiments, the first connection bus 94 and the conductive layer 20 may be made of the same material and arranged in the same layer, so that restrictions on the frame of the display panel may be less compared to a case where the first connection bus 94 and the conductive layer 20 are arranged in different layers. In some embodiments, the second connection bus 95 and the cathode layer 73 may be made of the same material and arranged in the same layer. This means that it is not necessary to make additional layers for the first connection bus 94 and the second connection bus 95, which is beneficial to simplify the process and save costs.

In the embodiment of the present disclosure, a current path of the low-voltage level signal (VSS) is changed from a single layer to a double layer, and the VSS current not only converges from the cathode layer 73 to the second connection bus 95 through the wires in the peripheral area 92, then flows into the integrated circuit interface 93, but also converges from the level signal wiring pattern in the conductive layer 20 to the integrated circuit interface 93 through the first connection bus 94, that is, there are current paths in upper and lower layers to conduct the VSS current in the display area. This not only reduces the voltage drop caused by the resistance, but also avoids concentrated heating. The integrated circuit interface 93 may be an integrated circuit device (may be called IC) that provides various signals (including power signals, control signals, data signals, etc.) to the circuits on the display panel.

Figure 9:
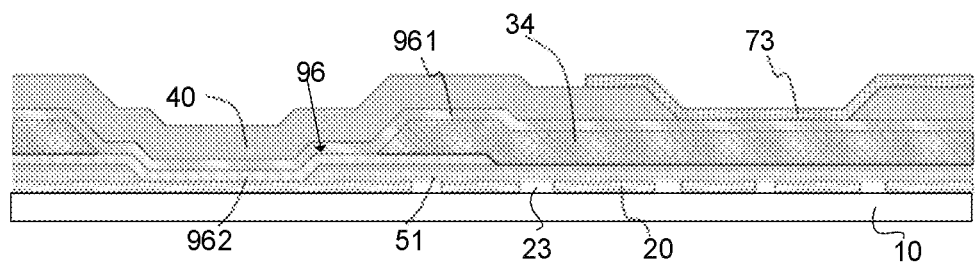
FIG. 9 schematically shows a connection relationship between a level signal wiring pattern in a conductive layer and a cathode layer in a peripheral area of a display panel according to some embodiments of the present disclosure.

FIG. 9 is an exemplary partial cross-sectional view of the peripheral area of the display panel 100 according to an embodiment of the present disclosure, showing an example of the connection relationship between the level signal wiring pattern in the conductive layer 20 and the cathode layer 73 in the peripheral area 92. As can be seen from FIG. 9, an electrical connection portion 96 is arranged in the peripheral area 92, and the level signal wiring pattern is electrically connected to the cathode layer 73 through the electrical connection portion 96. In some embodiments, the electrical connection portion 96 includes a first electrical connection layer 961 and a second electrical connection layer 962. The first electrical connection layer 961 and the anode layer 71 may be made of the same material and arranged in the same layer. The first electrical connection layer 961 is electrically connected to the cathode layer 73. The second electrical connection layer 962 is on a side of the conductive layer 20 away from the base substrate 10 and on a side of the first electrical connection layer 961 facing the base substrate 10. As an example, the second electrical connection layer 962 may be made of the same material and arranged in the same layer as the source electrode and drain electrode of the thin film transistor. In some embodiments, a plurality of insulating layers may also be provided in the peripheral area 92, for example, an insulating laminated layer 51 (for example, a buffer layer, a gate insulating layer, and an interlayer dielectric layer) between the conductive layer 20 and the second electrical connection layer 962, the planarization layer 34 between the first electrical connection layer 961 and the insulating laminated layer 51, and the pixel defining layer 40 between the cathode layer 73 and the anode layer 71. In some embodiments, the first electrical connection layer 961 and the second electrical connection layer 962 are connected together by a via-hole structure passing through the insulating laminated layer 51 and the planarization layer 34.

In the embodiment of the present disclosure, the expression "level signal wiring pattern" may refer to solid material portions of the conductive layer 20 which are electrically connected to the cathode layer 73. It is possible that all parts of the conductive layer 20 may be completely electrically connected to the cathode layer 73, or a part of the conductive layer 20 may be electrically connected to the cathode layer 73. Therefore, the level signal wiring pattern may refer to the whole of the conductive layer 20, or a part of the conductive layer 20. In the embodiments of the present disclosure, it is desirable that as many parts of the conductive layer 20 as possible be electrically connected to the cathode layer 73 to increase the conductive area of the level signal, thereby achieving a smaller voltage drop and less heat generation.

The display panel according to the embodiments of the present disclosure is not limited to the types and structures of the above-mentioned driving circuit, and any driving circuit that may achieve the necessary display function may be used as long as the VSS signal may be transmitted in parallel in both the conductive layer 20 and the cathode layer 73.

Figure 10:
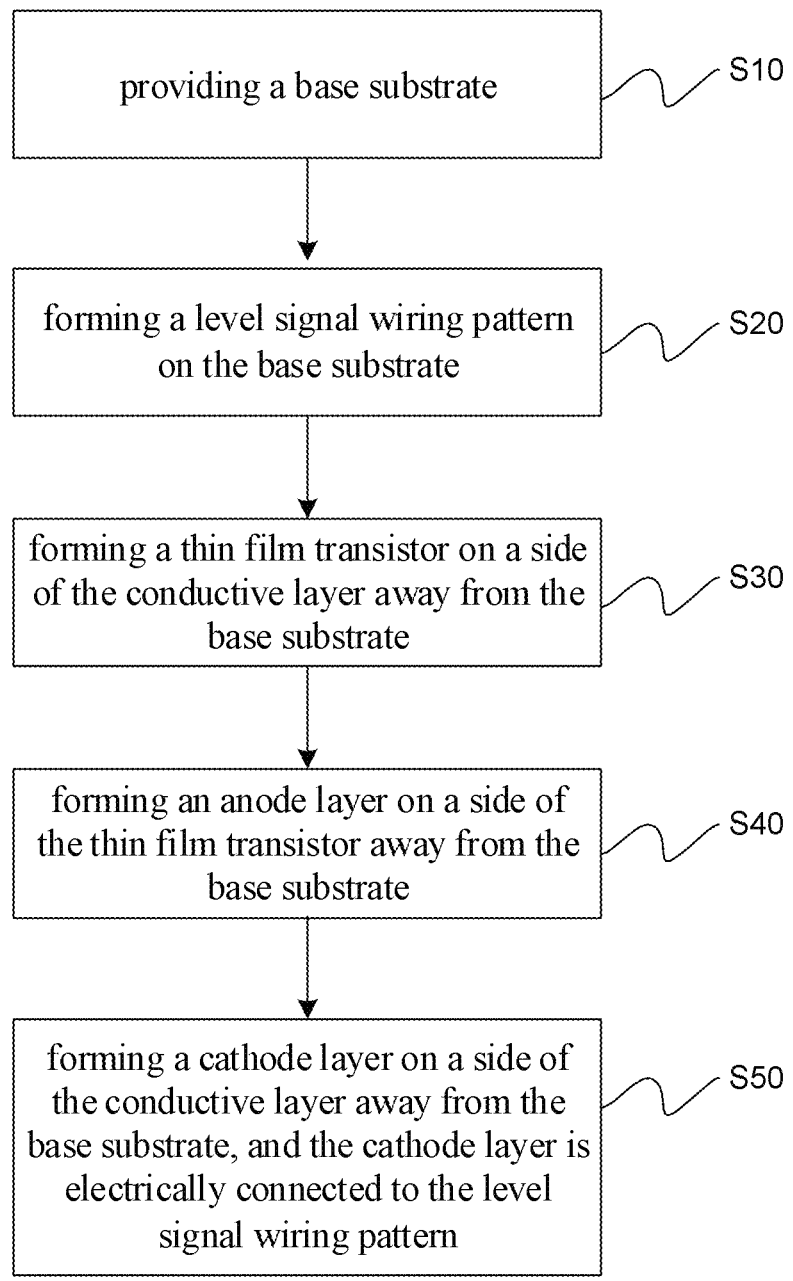
FIG. 10 schematically shows a flowchart of a method for manufacturing a display panel according to some embodiments of the present disclosure.

Embodiments of the present disclosure also provide a method for manufacturing a display panel. As shown in FIG. 10, the method includes the following steps:

S10: providing a base substrate;

S20: forming a conductive layer on the base substrate, the conductive layer including a level signal wiring pattern;

S30: forming a thin film transistor on a side of the conductive layer away from the base substrate;

S40: forming an anode layer on a side of the thin film transistor away from the base substrate; and S50: forming a cathode layer on a side of the conductive layer away from the base substrate, wherein the cathode layer is electrically connected to the level signal wiring pattern.

It can be seen from the above steps that the embodiments of the present disclosure may employ the conventional process flow of the display panel, for example, the display panel according to some embodiments of the present disclosure may include the follow steps: forming the conductive layer 20, the buffer layer 31, the active layer 63, the gate insulating layer 32, the gate layer (if required, two gate insulating layers and two gate layers may be formed, for example, first gate layer is used to fabricate the gate electrode of the TFT, and second gate layer is used to make one electrode of the storage capacitor), the interlayer dielectric layer 33, the source electrode and drain electrode layer, the planarization layer 34, the anode layer 71, the pixel defining layer 40, the cathode layer 73, and other layers on the base substrate 10 in sequence. The display panel according to the embodiments of the present disclosure does not need to form a new layer during the manufacturing process, but only needs to design the patterns in some layers. This is very helpful for cost savings.

In the embodiment of the present disclosure, the thickness of the conductive layer 20 may be from 2000 angstroms to 5000 angstroms. The conductive layer 20 may be made of metal materials such as molybdenum. The cathode layer 73 may be made of metal materials such as silver or aluminum.

Although the OLED display panel is described as an example in the embodiments of the present disclosure, those skilled in the art should understand that the embodiments of the present disclosure are not limited thereto. For example, the technical idea of the present disclosure may also be used for other types of displays panel.

Unless there are technical obstacles or contradictions, the above-mentioned various embodiments of the present disclosure can be freely combined to form additional embodiments, which are all within the protection scope of the present disclosure.

Although the present disclosure has been described with reference to the accompanying drawings, the embodiments disclosed in the accompanying drawings are intended to exemplify optional embodiments of the present disclosure, and should not be construed as a limitation of the present disclosure.

Although the present disclosure has been described with reference to several exemplary embodiments, it should be understood that the terms used are illustrative and exemplary rather than limiting. Since the present disclosure can be embodied in various forms without departing from the spirit or essence of the disclosure, it should be understood that the above-mentioned embodiments are not limited to any of the foregoing details, but should be widely interpreted within the spirit and scope defined by the appended claims. Therefore, all changes and modifications falling within the scope of the claims or their equivalents shall be covered by the appended claims.

What is claimed is:

1. A display panel, comprising:
    a base substrate;
    a conductive layer on the base substrate, the conductive layer comprising a level signal wiring pattern;
    a cathode layer on a side of the conductive layer away from the base substrate;
    an anode layer on the side of the conductive layer away from the base substrate and on a side of the cathode layer facing the base substrate;
    a thin film transistor on a side of the anode layer facing the base substrate and on the side of the conductive layer away from the base substrate, the thin film transistor comprising a source electrode, a drain electrode, an active layer, and a gate electrode,
    wherein the level signal wiring pattern is electrically connected to the cathode layer,
    wherein the thin film transistor is a P-type thin film transistor, and
    the conductive layer further comprises a first group of hollow portions, an orthographic projection of the first group of hollow portions on the base substrate covers an orthographic projection of the gate electrode of the P-type thin film transistor on the base substrate.

2. The display panel according to claim 1, wherein the orthographic projection of the first group of hollow portions on the base substrate covers an orthographic projection of the P-type thin film transistor on the base substrate.

3. The display panel according to claim 2, wherein an area of the orthographic projection of the first group of hollow portions on the base substrate is larger than an area of the orthographic projection of the P-type thin film transistor on the base substrate.

4. The display panel according to claim 1, further comprising a signal line on the side of the anode layer facing the base substrate and on the side of the conductive layer away from the base substrate, the conductive layer further comprises a second group of hollow portions, and an orthographic projection of the second group of hollow portions on the base substrate at least partially overlaps with an orthographic projection of the signal line on the base substrate.

5. The display panel according to claim 4, wherein the signal line comprises a data line or a clock signal line.

6. The display panel according to claim 4, wherein the conductive layer further comprises a third group of hollow portions, an orthographic projection of the third group of hollow portions on the base substrate neither overlaps with the orthographic projection of the thin film transistor on the base substrate, nor overlaps with the orthographic projection of the signal line on the base substrate.

7. The display panel according to claim 1, wherein the level signal wiring pattern is a mesh pattern.

8. The display panel according to claim 1, wherein the display panel comprises a display area and a peripheral area, an electrical connection portion is provided in the peripheral area, and the level signal wiring pattern is electrically connected to the cathode layer through the electrical connection portion.

9. The display panel according to claim 8, wherein the electrical connection portion comprises:
    a first electrical connection layer, the first electrical connection layer being made of the same material and arranged in the same layer as the anode layer, the first electrical connection layer being electrically connected with the cathode layer; and
    a second electrical connection layer, the second electrical connection layer being made of the same material and arranged in the same layer as the source electrode and the drain electrode of the thin film transistor, the second electrical connection layer being electrically connected with the level signal wiring pattern,
    wherein the first electrical connection layer is electrically connected with the second electrical connection layer.

10. The display panel according to claim 1, further comprising:
    a luminescent material layer between the anode layer and the cathode layer.

11. The display panel according to claim 1, further comprising:
    an integrated circuit interface;
    a first connection bus that electrically connects the level signal wiring pattern to the integrated circuit interface; and
    a second connection bus that electrically connects the cathode layer to the integrated circuit interface.

12. The display panel according to claim 11, wherein the first connection bus is made of the same material and arranged in the same layer as the conductive layer, and the second connection bus is made of the same material and arranged in the same layer as the cathode layer.

13. The display panel according to claim 1, wherein an orthographic projection of the level signal wiring pattern on the base substrate at least partially overlaps with an orthographic projection of the cathode layer on the base substrate.

14. A method for manufacturing a display panel, comprising:
    providing a base substrate;
    forming a conductive layer on the base substrate, the conductive layer comprising a level signal wiring pattern;
    forming a thin film transistor on a side of the conductive layer away from the base substrate;
    forming an anode layer on a side of the thin film transistor away from the base substrate; and forming a cathode layer on a side of the conductive layer away from the base substrate, wherein the cathode layer is electrically connected to the level signal wiring pattern, wherein the thin film transistor is a P-type thin film transistor, and the conductive layer further comprises a first group of hollow portions, an orthographic projection of the first group of hollow portions on the base substrate covers an orthographic projection of the gate electrode of the P-type thin film transistor on the base substrate.

\* \* \* \* \*

UNITED STATES PATENT AND TRADEMARK OFFICE
CERTIFICATE OF CORRECTION

| | |
|---|---|
| PATENT NO. | : 11,430,855 B2 |
| APPLICATION NO. | : 17/003872 |
| DATED | : August 30, 2022 |
| INVENTOR(S) | : Li Wang |

It is certified that error appears in the above-identified patent and that said Letters Patent is hereby corrected as shown below:

On the Title Page

Item (73) should be changed to --Beijing BOE Technology Development Co., Ltd.--

Signed and Sealed this
Twentieth Day of September, 2022

*Katherine Kelly Vidal*

Katherine Kelly Vidal
*Director of the United States Patent and Trademark Office*